United States Patent

Huang

[11] Patent Number: 5,841,633
[45] Date of Patent: Nov. 24, 1998

[54] CUP AND HEAT SINK MOUNTING ARRANGEMENT

[76] Inventor: Chuan-Wen Huang, No. 18, Lane 42, Alley 266, Futo 1 Road, Hsi-Chih, Taipei Hsien, Taiwan

[21] Appl. No.: 931,657

[22] Filed: Sep. 16, 1997

[51] Int. Cl.[6] ........................................ H05K 7/20
[52] U.S. Cl. .................. 361/695; 361/702; 361/704; 361/707; 361/717; 361/718; 257/718; 257/719; 257/722; 257/727; 174/16.3; 165/80.3
[58] Field of Search ................... 361/695, 697, 361/702, 704, 707, 709, 710; 257/718, 719, 722, 727; 174/16.3; 165/80.3, 185

[56] References Cited

U.S. PATENT DOCUMENTS 4,204,248  5/1980  Proffit et al. ...................... 361/707
5,353,863  10/1994  Yu ...................................... 165/80.3

*Primary Examiner*—Leo P. Picard
*Assistant Examiner*—Boris L. Chervinsky
*Attorney, Agent, or Firm*—Bacon & Thomas

[57] ABSTRACT

A CPU and heat sink mounting arrangement including a CPU shell mounted on a printed circuit board in a vertical position, a heat sink attached to one side of the CPU shell, a fan mount covered on the heat sink and fastened to the CPU shell to hold the heat sink in place, and a plurality of plug shafts respectively inserted through respective through holes on the fan mount and the heat sink into respective oval mounting holes on the CPU shell and then turned through a limited angle to force respective oval locating plates thereof into engagement with the oval mounting holes of the CPU shell.

5 Claims, 5 Drawing Sheets

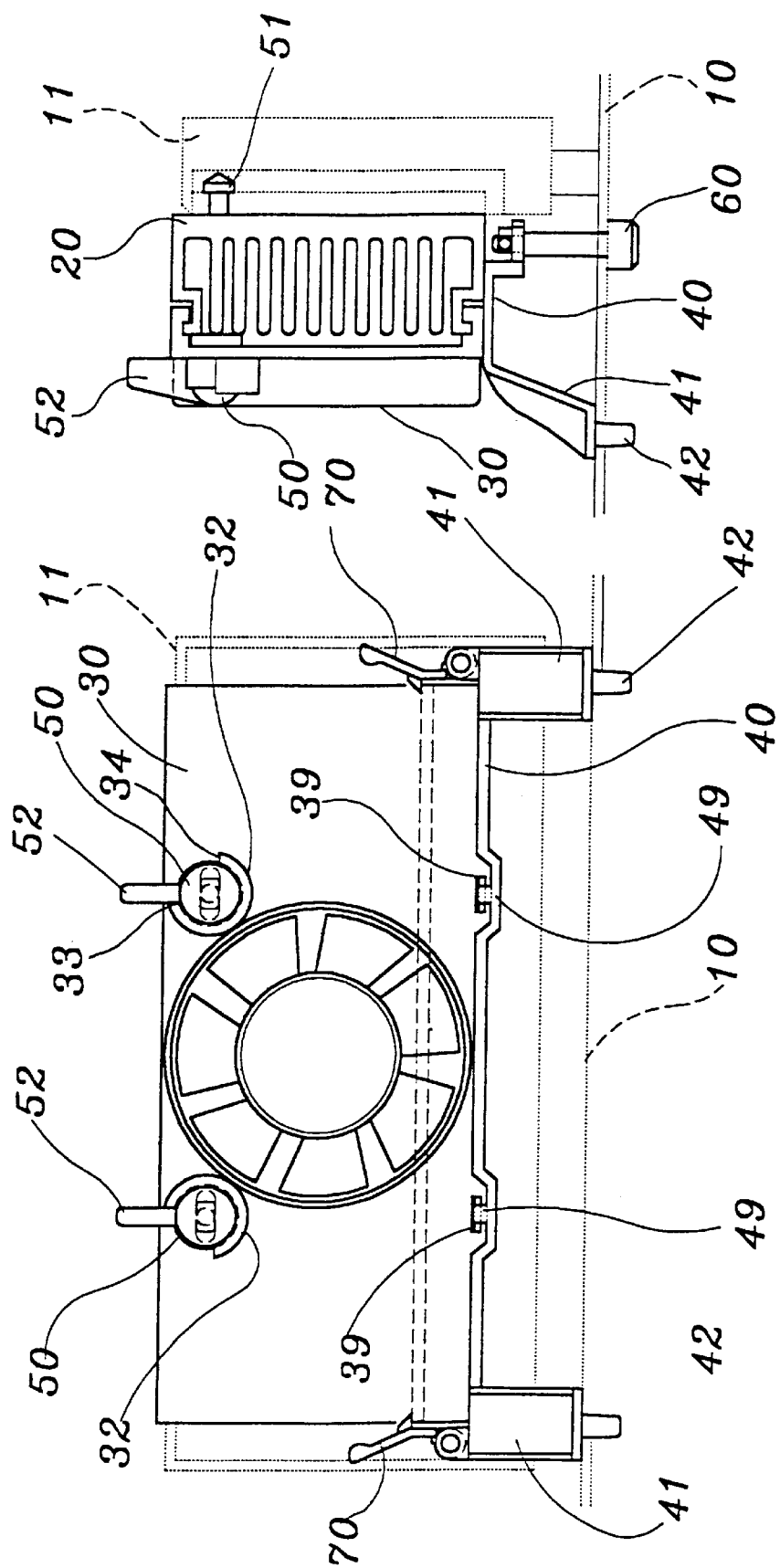

CUP AND HEAT SINK MOUNTING ARRANGEMENT

BACKGROUND OF THE INVENTION

The present invention relates to a CPU and heat sink mounting arrangement which comprises a CPU shell mounted on a printed circuit board in a vertical position, a heat sink attached to one side of the CPU shell, a fan mount covered on the heat sink and fastened to the CPU shell to hold the heat sink in place, and a plurality of plug shafts respectively inserted through respective through holes on the fan mount and the heat sink and fastened to respective oval mounting holes on the CPU shell through a rotary motion within a limited angle.

Conventionally, a CPU of a personal computer is mounted on a mother board in a horizontal position and closely attached to its one side. Nowadays, a CPU of an advanced personal computers is installed in a mother board in a vertical position so that less installation space on the mother board is occupied. When a CPU of a personal computer is installed, a heat dissipating device must be attached to one side of the CPU for quick dissipation of heat, and fastening means for example springy clamping devices are used to fix the heat dissipating device and the CPU together. However, attaching a heat dissipating device to a CPU makes the CPU heavier at one side. If a CPU is made heavier at one side, an error contact tends to occur, and the contact pins of the CPU tend to be damaged.

SUMMARY OF THE INVENTION

According to one aspect of the present invention, the CPU and heat sink mounting arrangement comprises a CPU shell mounted on a printed circuit board in a vertical position, a heat sink attached to one side of the CPU shell, a fan mount covered on the heat sink and fastened to the CPU shell to hold the heat sink in place, and a plurality of plug shafts respectively inserted through respective through holes on the fan mount and the heat sink into respective oval mounting holes on the CPU shell and then turned through a limited angle to force respective oval locating plates thereof into engagement with the oval mounting holes of the CPU shell. According to another aspect of the present invention, a support frame is mounted on the printed circuit board to support the heat sink and the fan mount is close contact with the CPU shell.

BRIEF DESCRIPTION OF THE DRAWINGS

FIG. 4 is a front view of FIG. 1;

FIG. 5 is a side view of FIG. 4;

DETAILED DESCRIPTION OF THE PREFERRED EMBODIMENT

Figure 1:
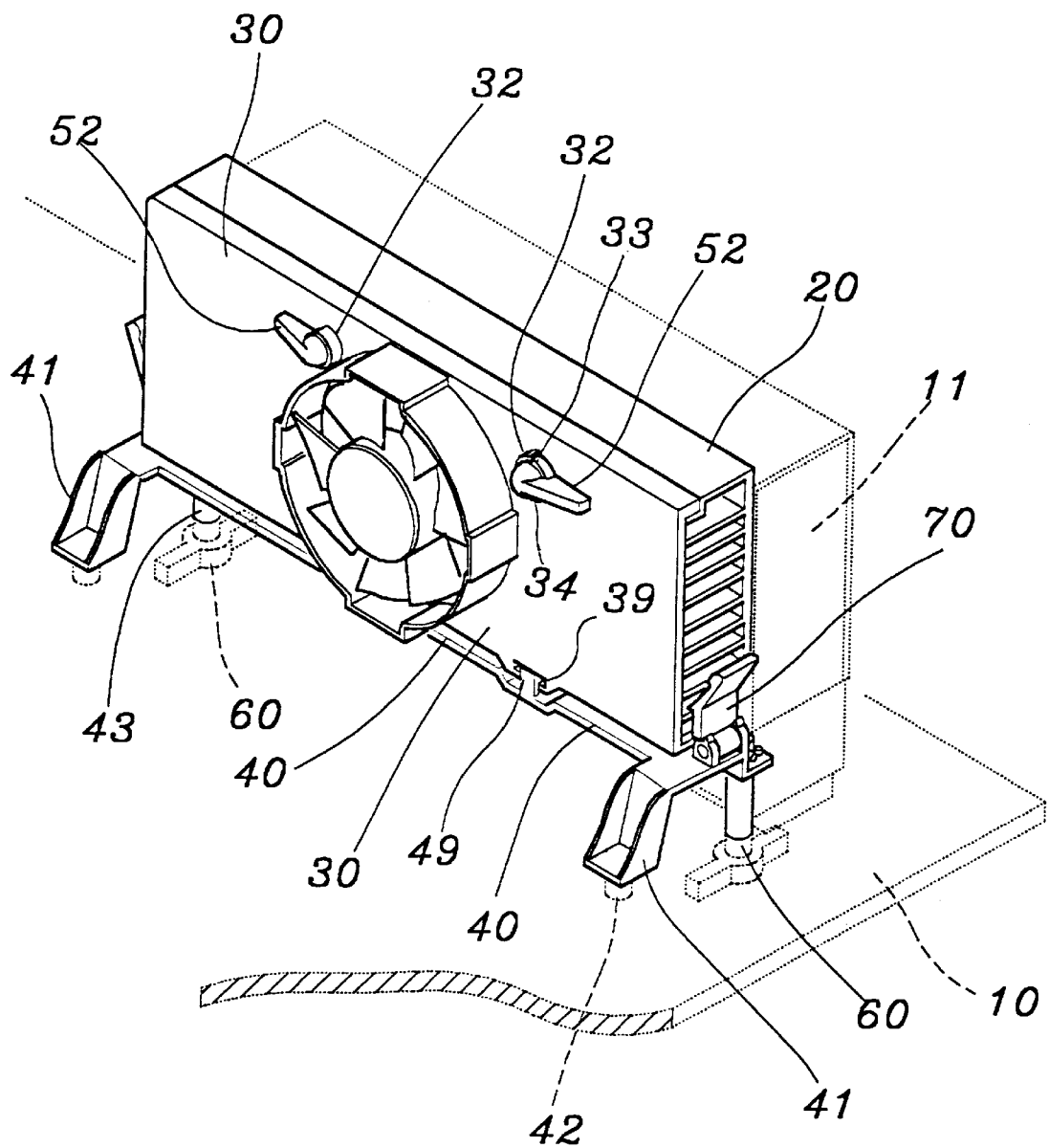
FIG. 1 is a perspective view of a CPU and heat sink mounting arrangement according to the present invention.

Referring to FIG. 1, a CPU shell 11 is mounted on a PC (printed circuit) board 10 in a vertical position. A heat sink 20 is attached to one side of the CPU shell 11. A fan mount 30 is covered on the heat sink 20 and fastened to the CPU shell 11 to hold the heat sink 20 in place. A support frame 40 is mounted on the PC board 10 to support the heat sink 20 and the fan mount 30.

Figure 2:
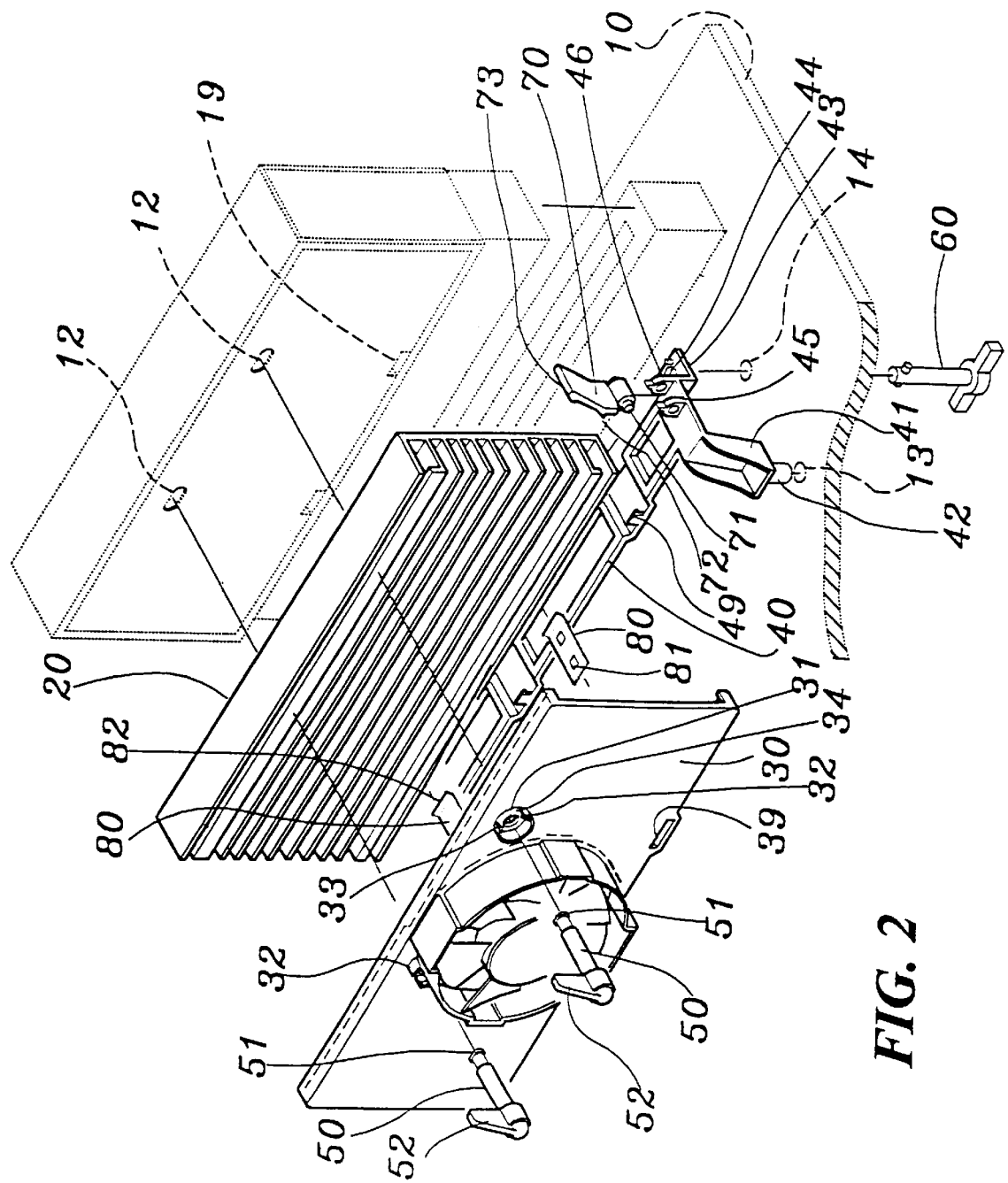
FIG. 2 is an exploded view of FIG. 1.
Figure 3:
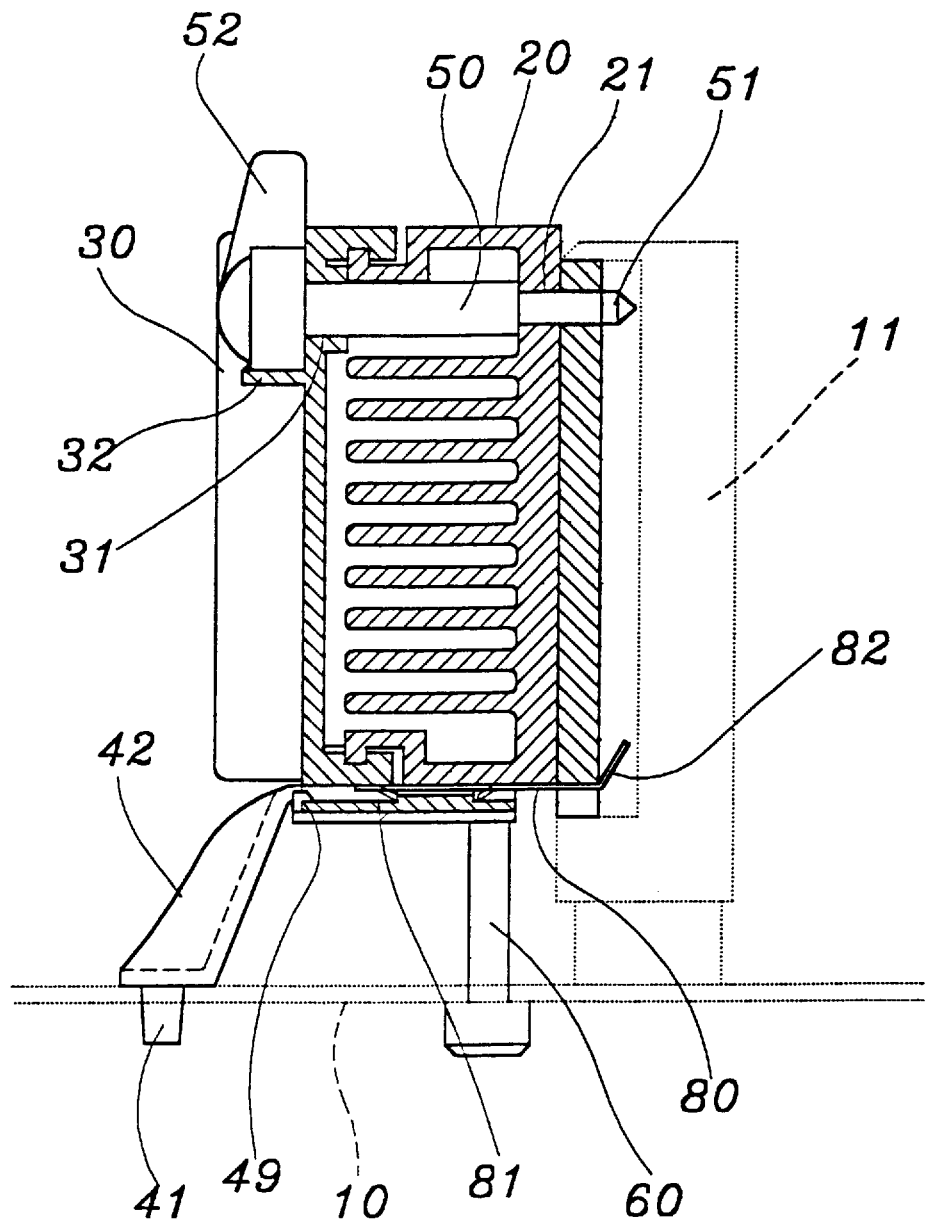
FIG. 3 is a side view in section in an enlarged scale of FIG. 1, showing the plug shafts not locked.
Figure 6:
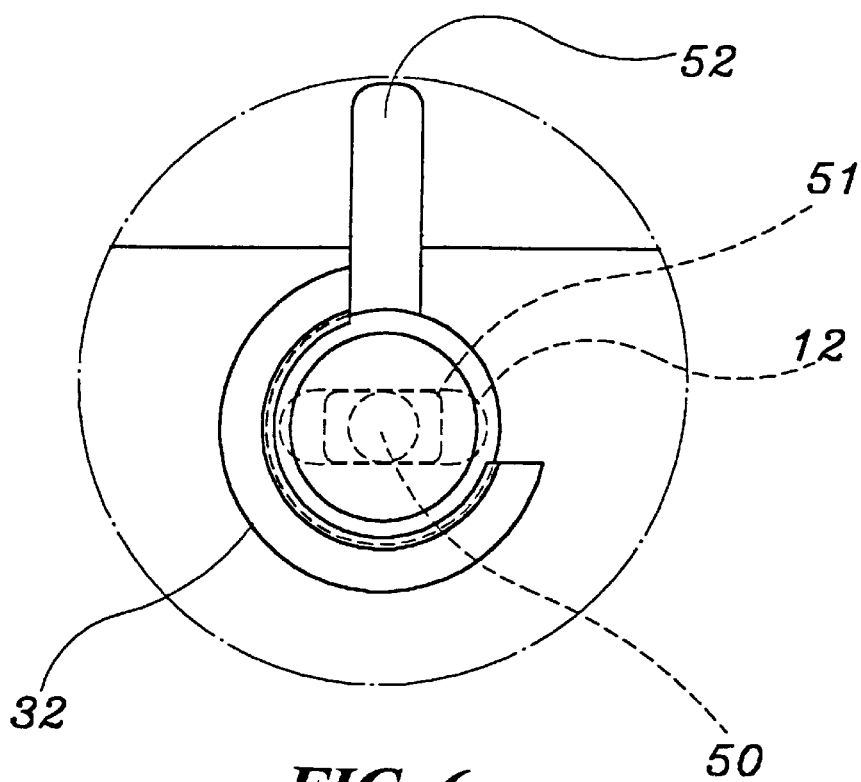
FIG. 6 is an enlarged view of a part of FIG. 4, showing the plug shafts not locked.
Figure 7:
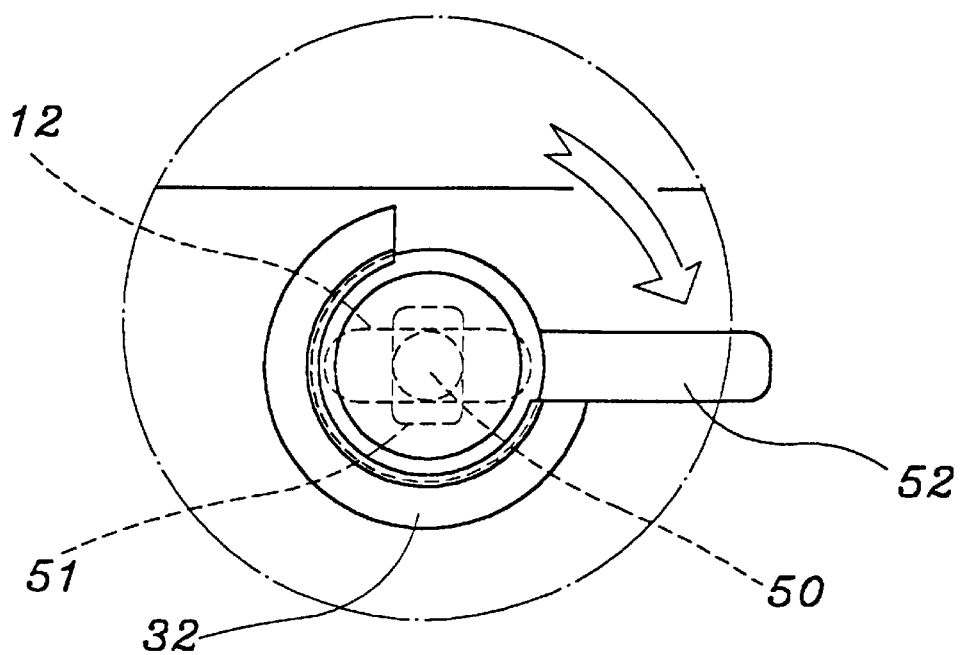
FIG. 7 is similar to FIG. 6 but showing the plug shafts turned to the locking position.

Referring to FIGS. 2 and 3 and FIG. 1 again, the heat sink 20 and the fan mount 30 have respective through holes 21;31 respectively connected to respective oval mounting holes 12 of the CPU shell 10 by a respective plug shaft 50. The plug shaft 50 has an oval locating plate 51 at one end, and a handle 52 at an opposite end. When the plug shaft 50 is inserted through one through hole 31 of the fan mount 30 and one through hole 21 of the heat sink 20 into one oval mounting hole 12 of the CPU shell 11, it is turned through a certain angle to force its oval locating plate 51 into engagement with an inside wall of the CPU shell 10 behind the corresponding oval mounting hole 12. An annular flange 32 is raised from one side of the fan mount 30 around each through hole 31. The annular flange 32 comprises an angle notch defining an upper stop edge 33 and a lower top edge 34 adapted for limiting the turning angle of the respective plug shaft 50.

The support frame 40 is an elongated frame comprising two legs 41 disposed at its two opposite ends, each leg 41 having a bottom plug rod 42 fitted into a respective mounting hole 13 on the PC board 10, two mounting strips 43 disposed at its two opposite ends, each mounting strip 43 having an oblong slot 44 fastened to a respective mounting hole 14 on the PC board 10 by a respective plug member 60, two pairs of coupling lugs 45;46 respectively disposed at its two opposite ends between the legs 41 and the mounting strips 43, and two holding down devices 70 respectively pivoted to the coupling lugs 45;46 to secure the heat sink 20 to the support frame 40. Each holding down device 70 comprises a transverse pivot shaft 71 at the bottom pivotably coupled between the respective pair of coupling lugs 45;46, a top finger strip 73 at the top adapted for turning the pivot shaft 71 by hand, and a hooked portion 72 in the middle at an inner side moved with the top finger strip 73 into engagement with the radiating fins of the heat sink 20 at one side.

Retainer plates 80 are respectively mounted on the support frame 40. The support frame 40 is made in a hollow structure. Each retainer plate 80 comprises a plurality of downward hooks 81 respectively raised from its bottom side and hooked in an open space of the support frame 40, and a forward hook 82 extended from its front side and forced into engagement with one hook hole 19 of the CPU shell 10. Upward hooks 49 are integral with one long side of the support frame 40. When the fan mount 30 is covered on the heat sink 20 and supported on the support frame 40, the upward hooks 49 are respectively forced into engagement with respective hook holes 39 of the fan mount 30.

Referring to Figures from 4 to 7, when the heat sink 20 and the fan mount 30 are fastened together and attached to the CPU shell 10, the holding down devices 70 are turned upwardly inwards to force the respective hooked portions 72 into engagement with the heat sink 20, the upward hooks 49 are respectively forced into engagement with the hook holes 39 of the fan mount 30, the forward hooks 82 of the retainer plates 80 are respectively forced into engagement with the hook holes 19 of the CPU shell 10, the plug shafts 50 are respectively inserted through the through holes 31 of the fan mount 30 and the through holes 21 of the heat sink 20 into the oval mounting holes 12 of the CPU shell 10 and then turned through 90° angle to force the respective oval locating plates 51 into engagement with the oval mounting holes 12 of the CPU shell 10. On the contrary, when the plug shafts 50 are turned in the reversed direction to disengage the respective oval locating plates 51 from the respective oval mounting holes 12 of the CPU shell 10 and the holding down devices 70 are respectively turned outwards to disengage the respective hooked portions 72 from the heat sink 20, the CPU shell 10, the heat sink 20, the fan mount 30 and the support frame 40 can then be detached from one another.

While only one embodiment of the present invention has been shown and described, it will be understood that various modifications and changes could be made thereunto without departing from the spirit and scope of the invention disclosed.

What the invention claimed is:

1. A CPU and heat sink mounting arrangement comprising a CPU shell mounted on a printed circuit board in a vertical position, a heat sink attached to one side of said CPU shell, a fan mount covered on said heat sink and fastened to said CPU shell to hold said heat sink in place, and fastening means adapted to fasten said fan mount and said heat sink to said CPU shell, wherein: said CPU shell comprises a plurality of oval mounting holes; said heat sink comprises a plurality of through holes respectively connected to the oval mounting holes of said CPU shell; said fan mount comprises a plurality of through holes respectively connected to the through holes of said heat sink and the oval mounting holes of said CPU shell; said fastening means comprises a plurality of plug shafts respectively inserted into the through holes of said fan mount and said heat sink and the oval mounting holes of said CPU shell and forced into engagement with the oval mounting holes of said CPU shell through rotary motion within a limited angle, each of said plug shafts having a handle at one end for turning by hand, and an oval locating plate at one end inserted into one oval mounting hole of said CPU shell and turned with said handle through an angle into engagement with the respective oval mounting hole of said CPU shell.

2. The CPU and heat sink mounting arrangement of claim 1 wherein said fan mount comprises a plurality of annular flanges respectively raised from one side thereof around each through hole of said fan mount, each of said annular flanges having an angle notch defining an upper stop edge and a lower stop edge adapted to limit the turning angle of the respective plug shaft in the respective through hole of said fan mount.

3. The CPU and heat sink mounting arrangement of claim 1, further comprising a support frame mounted on the printed circuit board and adapted to support said heat sink and said fan mount.

4. The CPU and heat sink mounting arrangement of claim 3, wherein said support frame is an elongated frame comprising two legs disposed at two opposite ends, each of said legs having a bottom plug rod fitted into a respective mounting hole on the printed circuit board, two mounting strips disposed at two opposite ends adjacent to said legs, said mounting strips having a respective oblong slot fastened to a respective mounting hole on the printed circuit board by a respective plug member, two pairs of coupling lugs respectively disposed at two opposite ends between said legs and said mounting strips, and two holding down devices respectively pivoted to said coupling lugs and turned between a first position in which said holding down devices are respectively forced into engagement with said heat sink to hold down said heat sink on said support frame, and a second position in which said holding down devices are respectively disengaged from said heat sink.

5. The CPU and heat sink mounting arrangement of claim 4, wherein said mounting frame has a hollow structure mounted with a plurality of retainer plates and integral with a plurality of upward hooks at a rear side thereof, each of said retainer plate comprising a plurality of downward hooks at a bottom side respectively hooked in an open space of said support frame and a forward hook at a front side respectively forced into engagement with a respective hook hole on said CPU shell, said upward hooks of said mounting frame being respectively forced into engagement with respective hook holes on said fan mount.

\* \* \* \* \*